United States Patent [19]

Tanagawa

[11] Patent Number: 5,119,330

[45] Date of Patent: Jun. 2, 1992

[54] NONVOLATILE MEMORY SYSTEM FOR MULTIPLE VALUE STORING

[75] Inventor: Kouji Tanagawa, Tokyo, Japan

[73] Assignee: Oki Electric Industry Co, Ltd., Tokyo, Japan

[21] Appl. No.: 498,685

[22] Filed: Mar. 26, 1990

[30] Foreign Application Priority Data

Mar. 31, 1989 [JP] Japan .................. 1-81816

[51] Int. Cl.$^5$ ...................... G11C 11/34; G11C 11/56
[52] U.S. Cl. .................................. 365/168; 365/185
[58] Field of Search ................ 365/168, 104, 45, 185, 365/189.07, 184

[56] References Cited

U.S. PATENT DOCUMENTS

| 4,090,258 | 5/1978 | Cricchi ................... 365/184 |
| 4,181,980 | 1/1980 | McCoy .................... 365/185 |
| 4,460,978 | 7/1984 | Jiang et al. ............. 365/185 X |
| 4,653,023 | 3/1987 | Suzuki et al. ........... 365/168 |
| 4,797,856 | 1/1989 | Lee et al. ............... 365/189.07 |
| 4,809,224 | 2/1989 | Suzuki et al. ........... 365/168 |
| 4,841,483 | 6/1989 | Furuyama ................ 365/182 |
| 4,890,259 | 12/1989 | Simko ................... 365/185 |
| 4,907,202 | 3/1990 | Kouzi ................... 365/218 |
| 4,964,079 | 10/1990 | Devin ................... 365/168 |

FOREIGN PATENT DOCUMENTS

| 0081347 | 6/1983 | European Pat. Off. . |
| 0098654 | 1/1984 | European Pat. Off. . |
| 0254139 | 1/1988 | European Pat. Off. . |
| 0284724 | 10/1988 | European Pat. Off. . |
| 67997 | 5/1980 | Japan . |
| 59693 | 3/1989 | Japan . |

OTHER PUBLICATIONS

Bleiker et al., "A Four-State EEPROM using Floating Gate Memory Cells", IEEE Journal of Solid-State Circuits, vol. SC-22, No. 3, Jun. 1987, pp. 460-463.
"Japanese Develop Nondestructive Analog Semiconductor Memory", Electronics, Jul. 11, 1974, pp. 29-30.
Lucero, E. M., et al., "A 16 kbit Smart 5 V-Only EEPROM with Redundancy", IEEE Journal of Solid-State Circuits, vol. SC-18, No. 5, pp. 539-544, Oct. 1983.

Primary Examiner—Joseph A. Popek
Assistant Examiner—Michael A. Whitefield
Attorney, Agent, or Firm—Spencer, Frank & Schnedier

[57] ABSTRACT

A nonvolatile memory system for one of a multiple of values includes a memory cell having an input terminal, an output terminal, and a control terminal. The memory cell, which may be an EEPROM, stores nonvolatile electric charge, and establishes a voltage threshold between the input terminal and the output terminal which influences a current therebetween, the threshold having a level which is dependent upon the amount of the electric charge stored by the storing means. A writing circuit is connected to the input terminal and is responsive to an input data signal having a value selected from among at least three values for applying electric charge, in an amount corresponding to the value of the selected data signal, to the input terminal for storage in the memory cell. A reading circuit is provided to measure the value of the voltage threshold between the input and output terminals and to output a data signal having a value which corresponds to the measured value of the threshold voltage. In its preferred embodiments, the system is an electrically erasable programmable read only memory system which can store multiple values in a single memory cell.

13 Claims, 16 Drawing Sheets

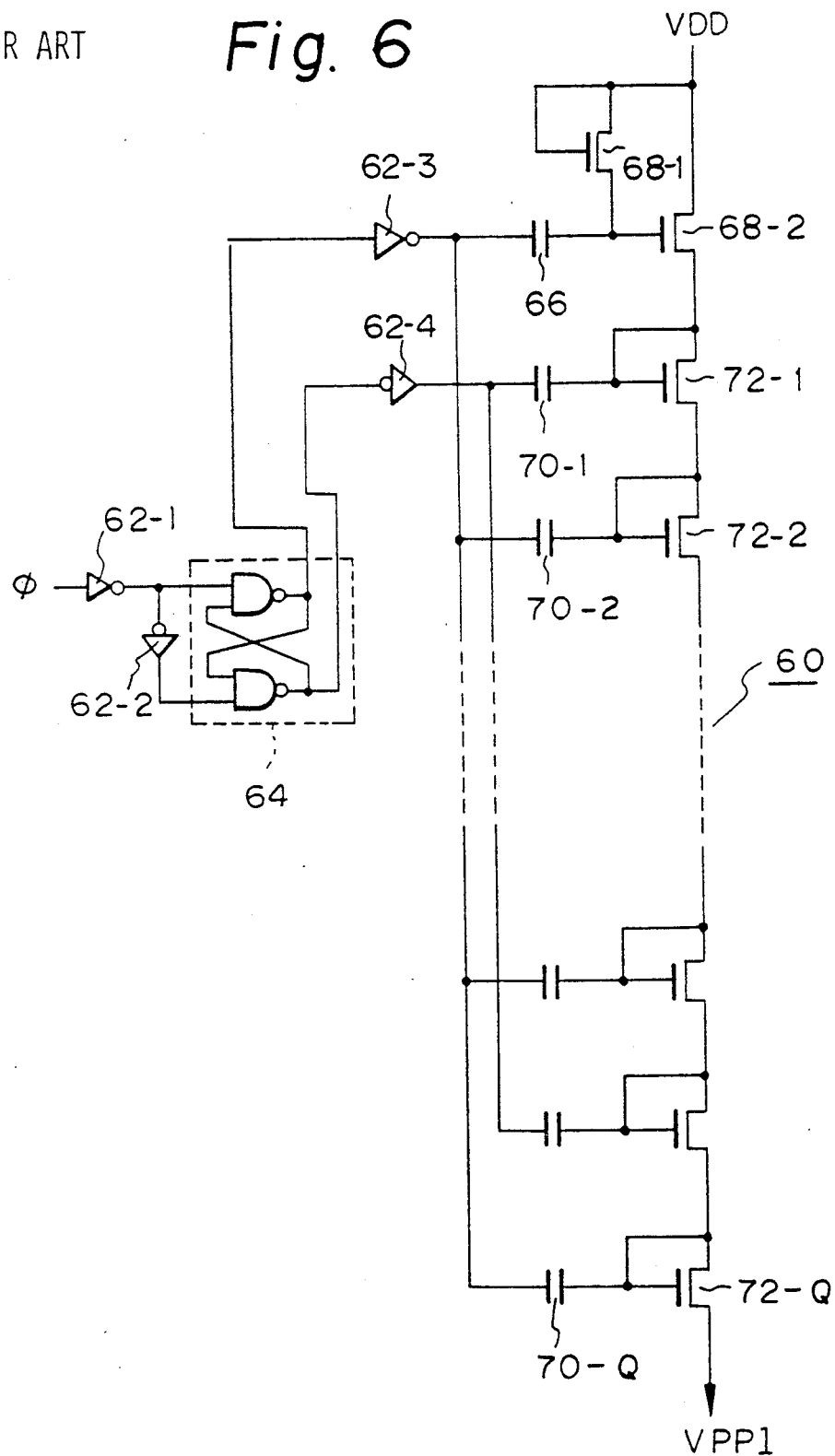
PRIOR ART Fig. 6

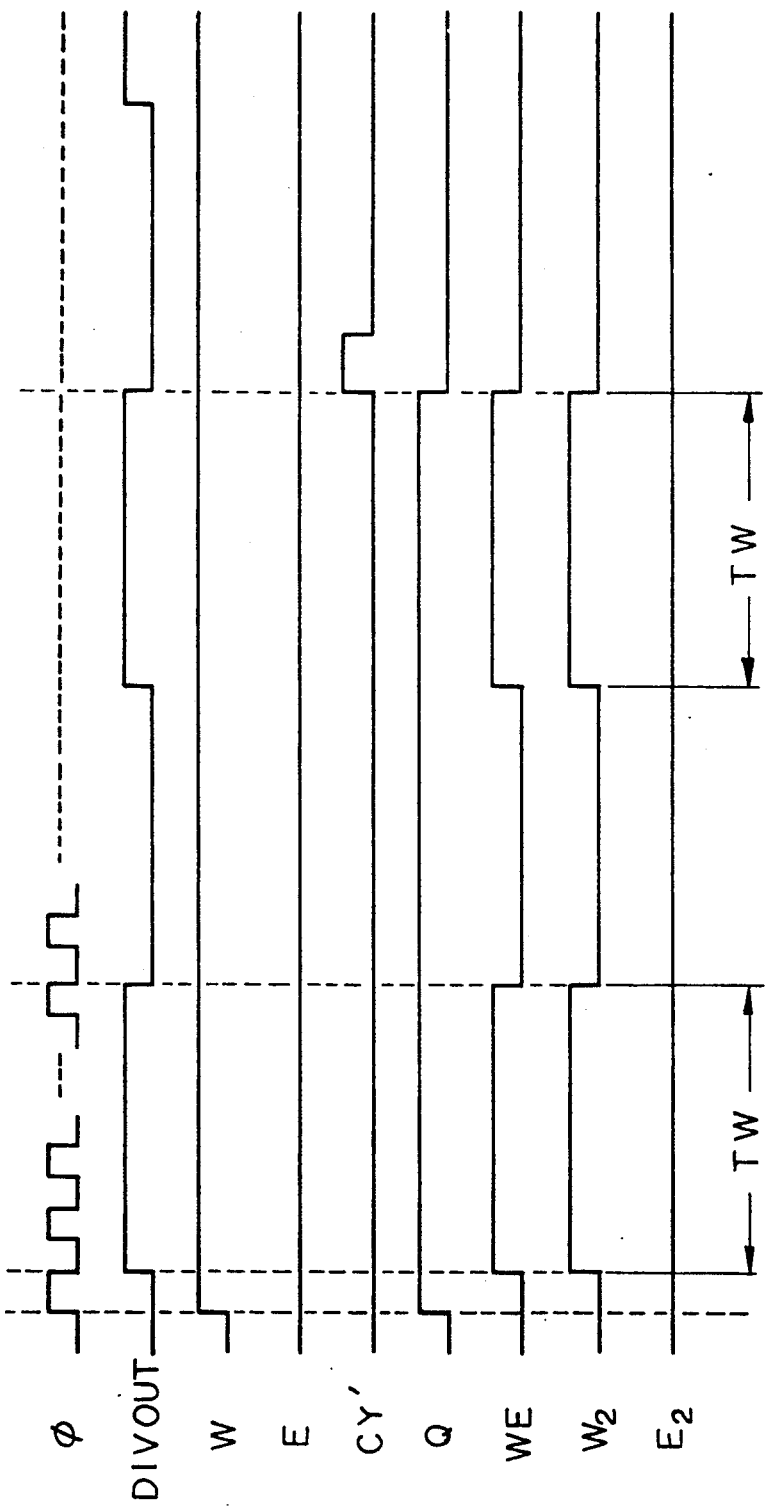

NONVOLATILE MEMORY SYSTEM FOR MULTIPLE VALUE STORING

REFERENCE TO RELATED APPLICATIONS

This application claims the right of priority under 35 U.S.C. 119 of Japanese Application Ser. No. 81816/89, filed on Mar. 31, 1989, the entire disclosure of which is incorporated herein by reference.

BACKGROUND OF THE INVENTION

1. Field of the Invention

This invention relates to a nonvolatile memory system, and particularly to a floating gate type, Electrically Erasable and Programmable Read Only Memory system (hereinafter, EEPROM system) which can store multiple values in one memory cell thereof.

2. Brief Description of the Related Art

An example of a conventional, nonvolatile memory system for storing multiple values in its single memory cell is disclosed in Japanese Kokai Publication, No. 67997/80.

FIG. 1 is a circuit diagram of the memory cell of the conventional nonvolatile memory system described in the Japanese Kokai publication, No. 67997/80. As shown in FIG. 1, the memory cell comprises a first diode 16 and a second diode 20, which are easily caused to break down by supplying a reverse voltage, a first series of conventional diodes 18-1 to 18-n (n an integer greater than 1), and a second series of conventional diodes 22-1 to 22-m (m an integer greater than 1, m≠n).

A cathode of the first diode 16 is connected to a first address line 10, and a cathode of the second diode 20 is connected to a second address line 12. Further, a cathode of the lead diode 18-1 of the first series of conventional diodes 18-1 to 18-n is connected to a selection line 14, and a cathode of the lead diode 22-1 of the second series of the conventional diodes 22-1 to 22-m is also connected to the selection line 14. An anode of the first diode 16 is connected to an anode of the last diode 18-n of the first series of the conventional diodes 18-1 to 18-n, and an anode of the second diode 20 is connected to an anode of the last diode 22-m of the second series of the conventional diodes 22-1 to 22-m.

In a writing process, there is provided a relatively high reverse potential between the selection line 14 and the first address line 10 and/or between the selection line 14 and the second address line 12. Thereby, the first diode 16 and/or the second diode 20 is caused to break down and loses its diode characteristic. In other words, the diode 16 and/or 20 becomes an ordinary conductor.

On the other hand, in a reading process, there is provided a reading potential on the selection line 14 and an outer circuit (not shown) senses a voltage differences between the selection line 14 and both of the first address line 10 and the second address line 12. If either the first diode 16 or the second diode 20 has broken down, a voltage difference will appear by means of the first series of diodes 18-1 to 18-n or the second series of diodes 22-1 to 22-m.

Therefore, there are provided three different values of the voltage difference according to the break down status of the cell.

In this way, there can be stored one of three "values" in the single memory cell, such as respective representing: (1) both of the diodes have broken down, (2) one of the diodes has broken down, or (3) neither of the diodes has broken down.

However, the above described circuit configuration has the following disadvantages:

(1) Once either of the first and second diodes 16 and 20 has broken down, this is a permanent condition so the memory cell cannot be rewritten. In other words, this circuit configuration is a destructive read only memory.

(2) Since the number of different values which a single memory cell can store is dependent on the number of the diodes in the memory cell, it is necessary to include a large number of diodes in the memory cell if it is desired that the cell can store a large number of different values.

(3) It is necessary to provide a relatively high power source (0.5–1.0 W) for a writing process to cause the break down of the first and second diodes 16 and 20. Therefore, it is difficult to write into the memory cell if the memory cell is already assembled with another complete circuit. Further, it is difficult to write a plurality of values simultaneously into an array of such cells with low power consumption.

Another example of a known nonvolatile memory system, in the form of an EEPROM system, is disclosed in Japanese Kokai publication 59693/89 published on Mar. 7, 1989 which corresponds to U.S. Pat. No. 4,907,202 issued Mar. 6, 1990.

FIG. 2 is a block diagram of the EEPROM system described in the Kokai Publication 59693/89. As shown in FIG. 2, this EEPROM system comprises a clock pulse generator 24, a pumping circuit 26, a regulator circuit 28, a rise control circuit 30, a pair of high voltage switching circuit 32 and 34, a memory cell, and a reading circuit 38.

In this example, the clock pulse generator 24 generates a clock signal $\phi$ whose frequency is approximately 5 to 10 MHz and whose potential is 5 volts. The clock signal $\phi$ is pumped to a relatively high voltage signal VPP of 20 to 25 volts by the pumping circuit 26.

The high voltage signal VPP is regulated to have a predetermined potential level by the regulator circuit 28 and smoothed by the rise control circuit 30 to have a relatively slow rising waveform, for example, 16 v/ms. An object to smooth the shape of the high voltage signal VPP is to prevent destruction of the memory cell and a writing error caused by a too sharply rising waveform.

The high voltage signal VPP after being regulated and rise controlled by circuits 28 and 30, is output as a high voltage writing pulse WR to the memory cell 36 by the high voltage switching circuit 32 during a writing operation which is activated by a write enable signal W. The high voltage signal VPP is also applied as a high voltage erasing pulse ER to the memory cell 36 by the high voltage switching circuit 34 during an erasing operation which is activated by an erase enable signal E.

The memory cell 36 includes a conventional floating gate tunnel oxide type transistor (hereinafter, FLOTOX transistor). During a writing operation, the FLOTOX transistor stores positive electric charges in its floating gate so that the threshold between its drain and source is changed. During an erasing operation, those positive electric charges are removed from the floating gate to again change the threshold. The reading circuit 38 is activated by a read data signal RD and detects such a change of threshold and outputs an output data signal Dout.

However, since a high voltage pulse applied to the memory cell 36 for a writing operation has a fixed level and a fixed duration and the reading circuit 38 detects only whether the threshold has changed or not, the memory cell 36 can store only two values, these being represented by whether the threshold is high ("H") or low ("L").

OBJECTS AND SUMMARY OF THE INVENTION

An object of the invention is to provide a nonvolatile memory system which can store at least three values in its single memory cell.

A further object of the invention is to realize such a nonvolatile memory system with an EEPROM system.

To realize the above mentioned objects, we provide an EEPROM system which includes a conventional FLOTOX memory cell, and a writing circuit which, during a writing operation, receives an input signal and applies a predetermined amount of positive electric charges which corresponds to a level of the input signal to the floating gate of the memory cell.

The predetermined amount of positive electric charges may be applied to the floating gate of the FLOTOX memory cell as by, for example, applying a writing voltage which has a predetermined level during a fixed writing interval, applying a fixed writing voltage in a predetermined writing interval, or applying a predetermined number of fixed level and duration writing pulses. A reading circuit measures the level of a threshold of the FLOTOX memory cell and outputs an output data signal whose value corresponds to the threshold level. Another circuit may be provided for removing the stored positive electric charges from the floating gate of the memory cell.

BRIEF DESCRIPTION OF THE DRAWINGS

These and other features and advantages of the invention may be more completely understood from the following detailed description of the preferred embodiments of the invention with reference to the accompanying drawings in which:

FIG. 6 is a detailed circuit diagram of the pumping circuit of the EEPROM system illustrated in FIG. 4(a);

FIG. 14(b) is a timing chart of the EEPROM system illustrated in FIG. 14(a).

DESCRIPTION OF THE PREFERRED EMBODIMENTS

Figure 1:
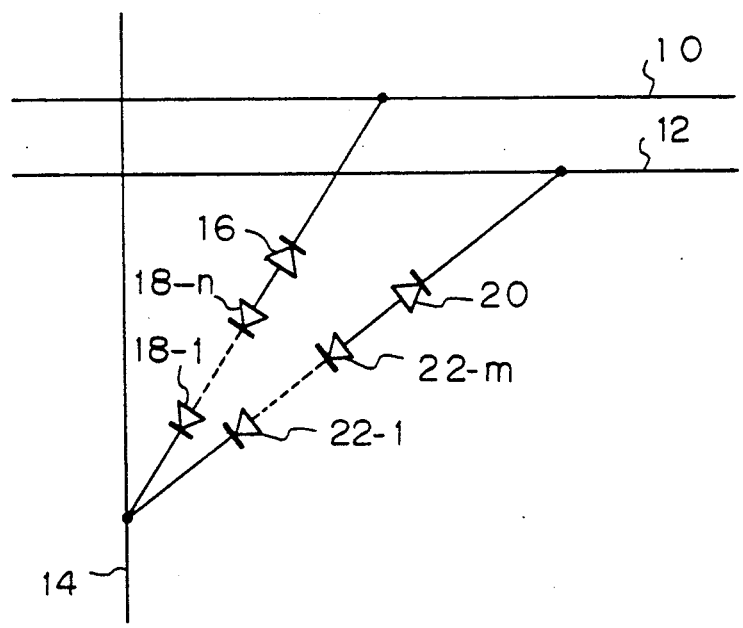
FIG. 1 is a circuit diagram of a memory cell in a first example of a conventional nonvolatile memory system which can store multiple values.
Figure 2:
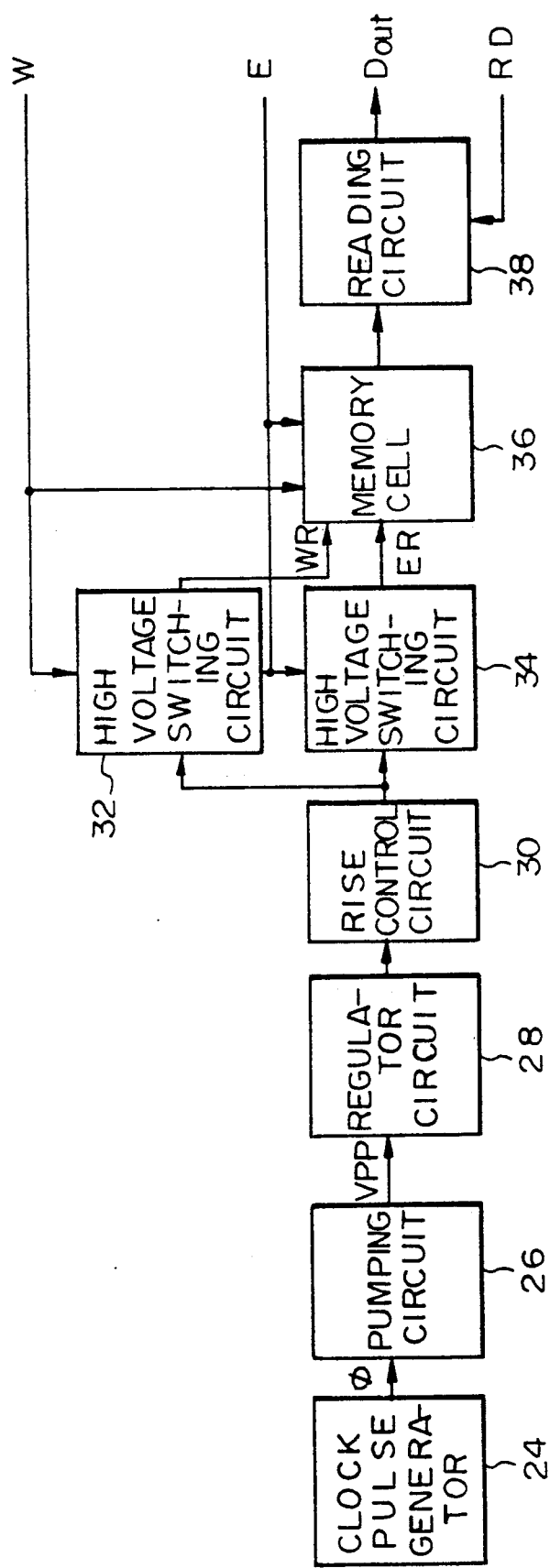
FIG. 2 is a block diagram of a conventional EEPROM system which can store only two values.
Figure 3A:
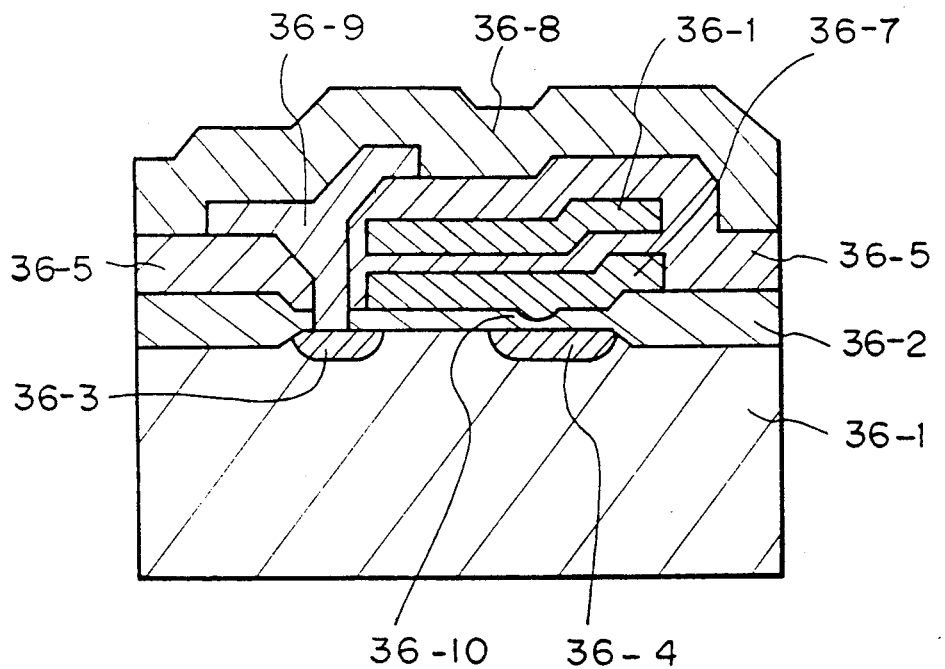
FIG. 3(a) is a sectional view of a conventional FLOTOX transistor used in the invention.

At first, the basic principle of the invention will be explained:

As shown in FIG. 3(a), a conventional FLOTOX transistor comprises a p-type substrate 36-1, a field electric insulation layer 36-2, a portion of which comprises a tunnel oxide layer 36-10, a drain 36-4 consisting of an n-type region juxtaposed to the substrate 36-1, a source 36-3 consisting of an n-type region also juxtaposed to the substrate 36-1, a phosphorus silicate glass layer 36-5 for insulation, a floating gate 36-7 for storing positive electric charge, a control gate 36-6 for applying the positive electric charge to the floating gate, an aluminum layer 36-9, and a passive layer 36-8 for physical protection. Of course, the n-type region for the drain 36-4 and the control gate 36-6 are connected to other respective aluminum layers (not shown) for input/output.

For a writing operation, the control gate 36-6 is grounded and a relatively high voltage potential, such as 15–20 V, is applied to the drain 36-4. Electrons in the floating gate 36-7 tunnel the tunnel oxide layer 36-10 and flow into the drain 36-4. In other words, positive electric charge is applied by the drain 36-4 to the floating gate 36-7. Because free electrons in the substrate 36-1 are attracted by the positive electric charges in the floating gate 36-7 and gather adjacent to the floating gate, therefore, those electrons reduce the threshold voltage for current flow between the source 36-3 and the drain 36-4. The electrons continue to flow from the floating gate until a steady state condition is reached.

For an erasing operation, the drain 36-4 is grounded and the relatively high voltage potential (15–20 V) is applied to the control gate. Thereby, stored positive electric charges in the floating gate 36-7 flow to the drain 36-4. In other words, electrons are applied to the floating gate 36-7 by the drain 36-4. Again the electron flow continues until a steady state is reached. As a result, the threshold voltage between the source 36-3 and the drain 36-4 for current flow therebetween shifts higher than the threshold produced by the writing operation.

Figure 3B:
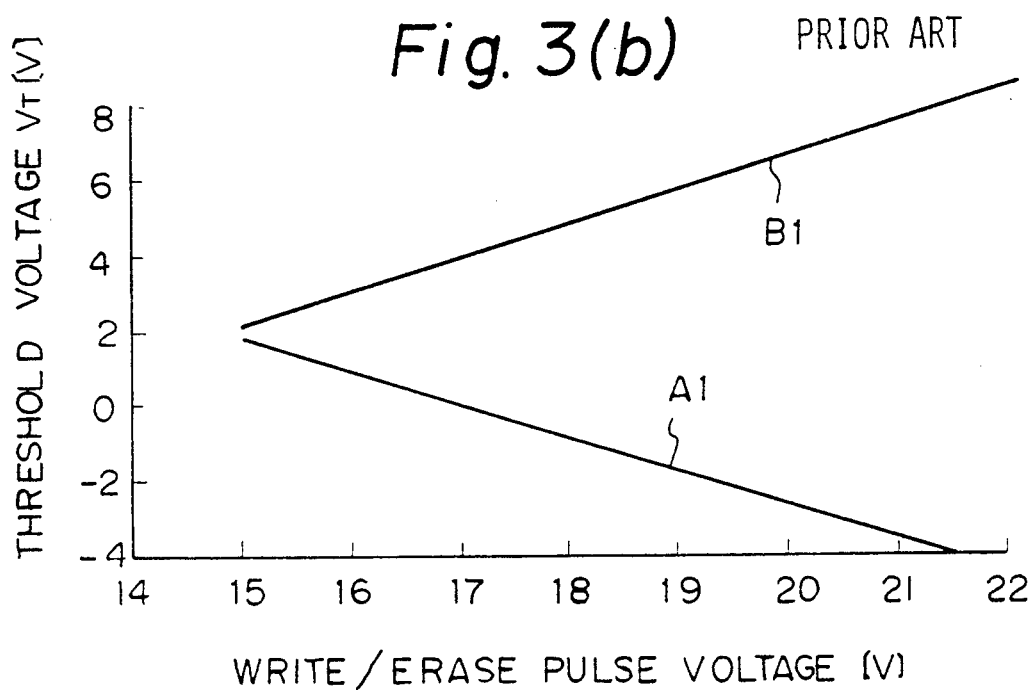
FIG. 3(b) is a line graph illustrating the relationship between a voltage and the resultant threshold in the FLOTOX transistor illustrated in FIG. 3(a) during a writing and erasing operation.

As shown in FIG. 3(b), the applied high voltage potential and the threshold of the FLOTOX transistor have a substantially linear relationship. In FIG. 3(b), the line A1 illustrates a case of writing and the line B1 illustrates a case of erasing. Because lines A1 and B1 are substantially symmetric with respect to a threshold voltage of 2.0 V, if a certain amount of voltage is applied to the drain 36-4 during a writing operation, it is necessary to apply the same amount of the voltage to the control gate 36-6 during a subsequent erasing operation.

According to the above-described method the threshold voltage is controlled by a relatively long application of a high voltage to the drain or control gate, that is a voltage of sufficient duration to permit the charge on the floating gate to reach a steady state. Here the charge on the floating gate depends only on the level of the applied voltage.

Figure 3C:
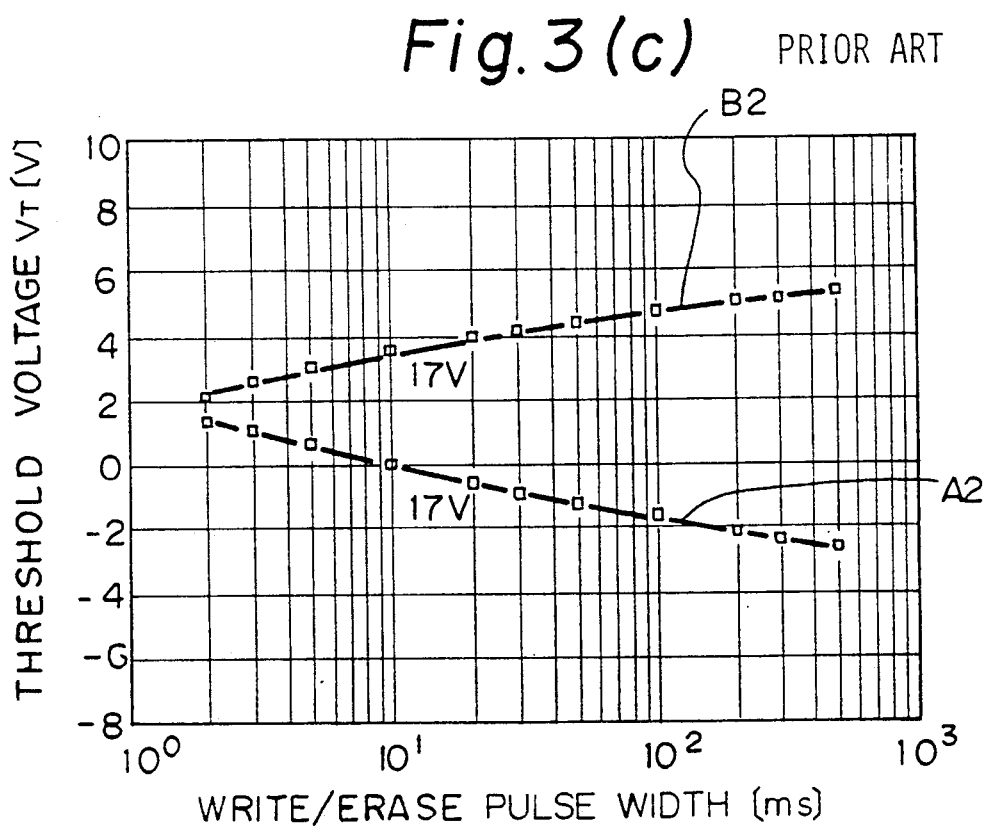
FIG. 3(c) is a line graph illustrating the relationship between the width of an applied pulse and the resultant threshold in the FLOTOX transistor illustrated in FIG. 3(a), during writing and erasing operations.

Alternatively, the charge may be applied to the floating gate with voltage pulses applied to the drain or control gate so that the amount of charge on the floating gate, and thus the threshold voltage, may be controlled by the width, amplitude and number of pulses so applied. FIG. 3(c) illustrates a relationship between the threshold of the FLOTOX transistor and a single high voltage pulse in a case where the voltage has a fixed value of 17 V. A line A2 illustrates a case of writing and a line B2 illustrates a case of erasing. The transfer speed of the electric charges (electrons) has a logarithmic relationship to the applied voltage potential. Therefore, the relationship between the threshold and the pulse width for both writing and erasing is substantially linear on a logarithmic scale. Further, it can be seen that the threshold could be alternatively controlled by controlling the number of applied pulses, each pulse having a fixed width and a fixed voltage level.

The invention utilizes the above mentioned physical characteristics of the FLOTOX transistor. First embodiment.

Figure 4A:
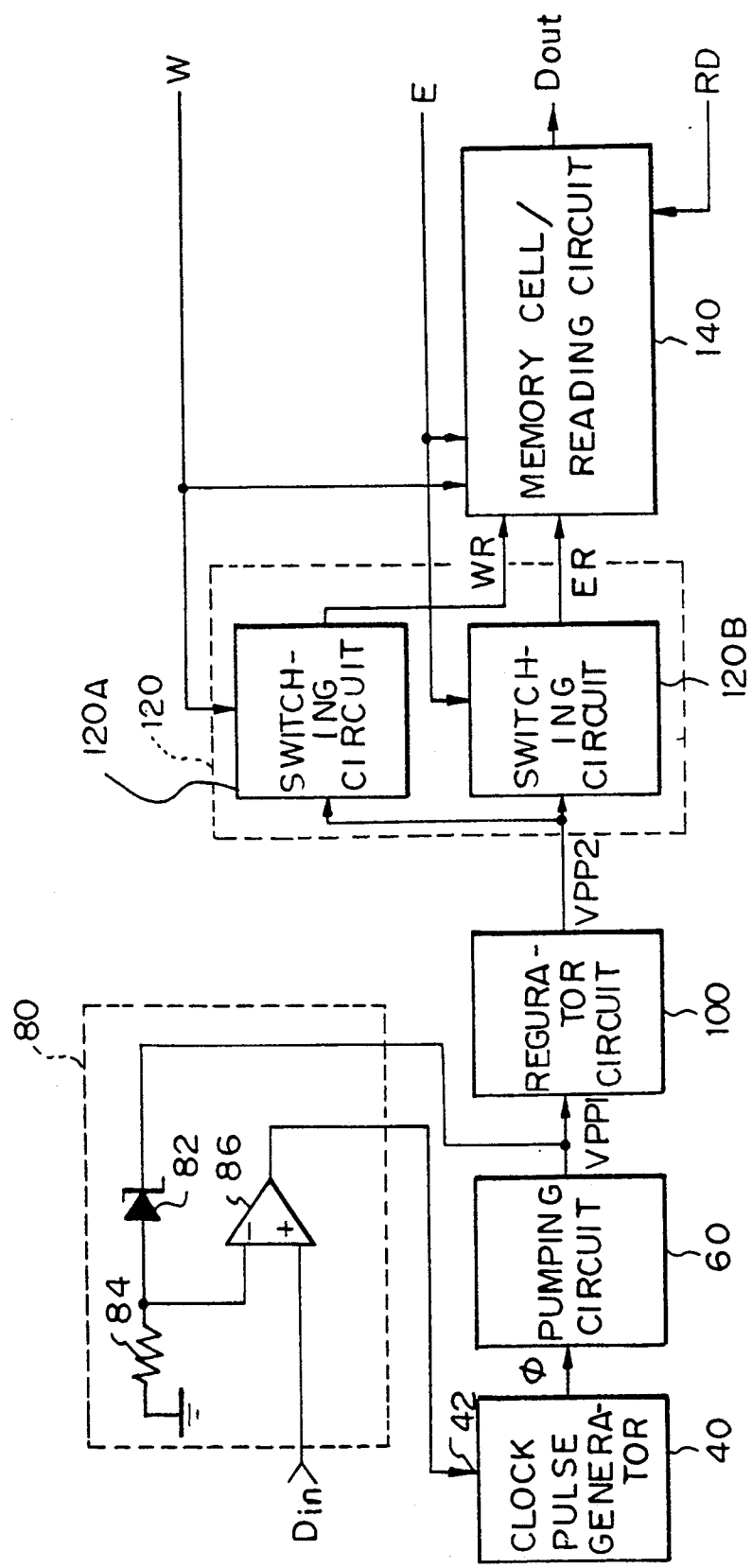
FIG. 4(a) is a block diagram of an EEPROM system according to a first embodiment of the invention.

As shown in FIG. 4(a), a first embodiment of the invention comprises in series a clock pulse generator 40, a pumping circuit 60, a regulator circuit 100, a switching circuit block 120 which includes a pair of switching circuits 120A and 120B and a memory cell/reading circuit 140. A voltage control circuit 80 is provided between the output of the pumping circuit 60 and the control input of the clock pulse generator 40 to feed back the output of the pumping circuit 60.

Figure 5:
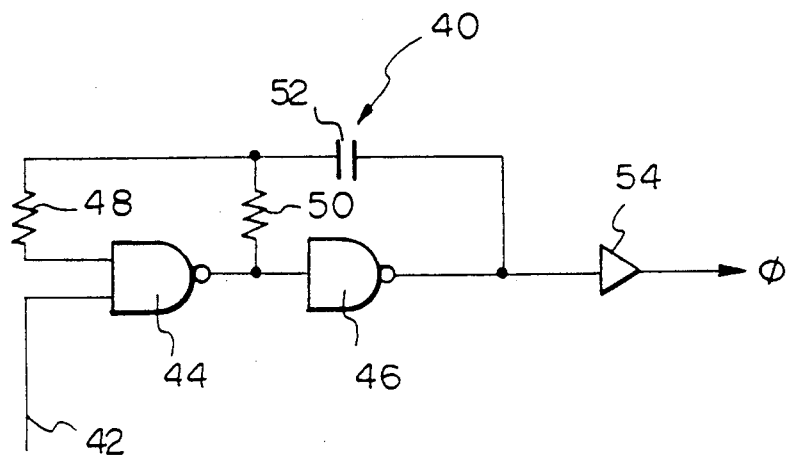
FIG. 5 is a detailed circuit diagram of the clock pulse generator of the EEPROM system illustrated in FIG. 4(a)

At first, the clock pulse generator 40 applies a clock signal $\phi$ of 10 MHz whose potential is 5 V. FIG. 5 is a detailed circuit diagram of the clock pulse generator 40. The clock pulse generator 40 comprises a first NAND gate 44 having two inputs one of which is a stop terminal 42, a second NAND gate 46 having one input which is connected to an output of the NAND gate 44, an inverter 54 which receives an output of the NAND gate 46 and outputs the clock signal $\phi$, and a time constant circuit comprising a capacitor 52 which connects the input and the output of the NAND gate 46 via a resistor 50 and a resistors 48 which connects the other input and the output of the NAND gate 44 via the resistor 50. This circuit configuration is conventional and the details are described in above-mentioned Japanese Kokai Publication 59693/89.

If an "H" level signal of 5 V is applied to the stop terminal 42, the clock pulse generator 40 starts its oscillation, and if an "L" level signal is applied to the stop terminal, the clock generator circuit 40 stops its oscillation.

The clock signal $\phi$ is applied to the pumping circuit 60. FIG. 6 is a detailed circuit diagram of the pumping circuit 60. This circuit configuration is also conventional and the details are described in the above mentioned Japanese Kokai publication 59693/89. The clock signal $\phi$ is applied to a flip-flop circuit 64 via inverters 62-1 and 62-2. The flip-flop circuit 64 outputs the clock signal $\phi$ and its inversion, which are input via another pair of inverters 62-3 and 62-4 to a pull up circuit comprising a capacitor 66 and two field effect transistors (hereinafter, FET's) 68-1 and 68-2 pulled up to a voltage source VDD (5 V), and to a plurality, Q in number, of pumping capacitors 70-1, ... 70-i, ... 70-Q (Q being integer, preferably between 10 and 13), alternate ones of which are connected to the output of inverter 62-4 and inverter 62-3. Each of the Q pumping capacitors 70-i, i=1 to Q, is connected to a corresponding pumping FET 72-i, i=1 to Q, by means of the pumping circuit 60, the clock signal $\phi$ is boosted to a high voltage signal VPP1 of 22 V to be used as a writing potential or an erasing potential.

Referring again to FIG. 4(a), applied to the voltage control circuit 80 is a data signal $D_{in}$ which has a predetermined value of potential within the approximate range 0 to 5 volts. The voltage control circuit 80 comprises a comparator 86, a zener diode 82 whose zener voltage is 15 V, and a load resistor 84. The negative input of the comparator 86 is connected to ground via the resistor 84 and to the output of the pumping circuit 60 via the zener diode 82 whose cathode is connected to the output of the pumping circuit 60 and anodo is connected to the negative input of the comparator 86.

The data signal $D_{in}$ is applied to a positive input of the comparator 86. The high voltage signal VPP1 is fed back to a negative input of the comparator 86 via the zener diode 82. Therefore, the comparator 86 cannot output a low ("L") level signal until the high voltage signal VPP1 exceeds approximately 15 V.

Figure 4B:
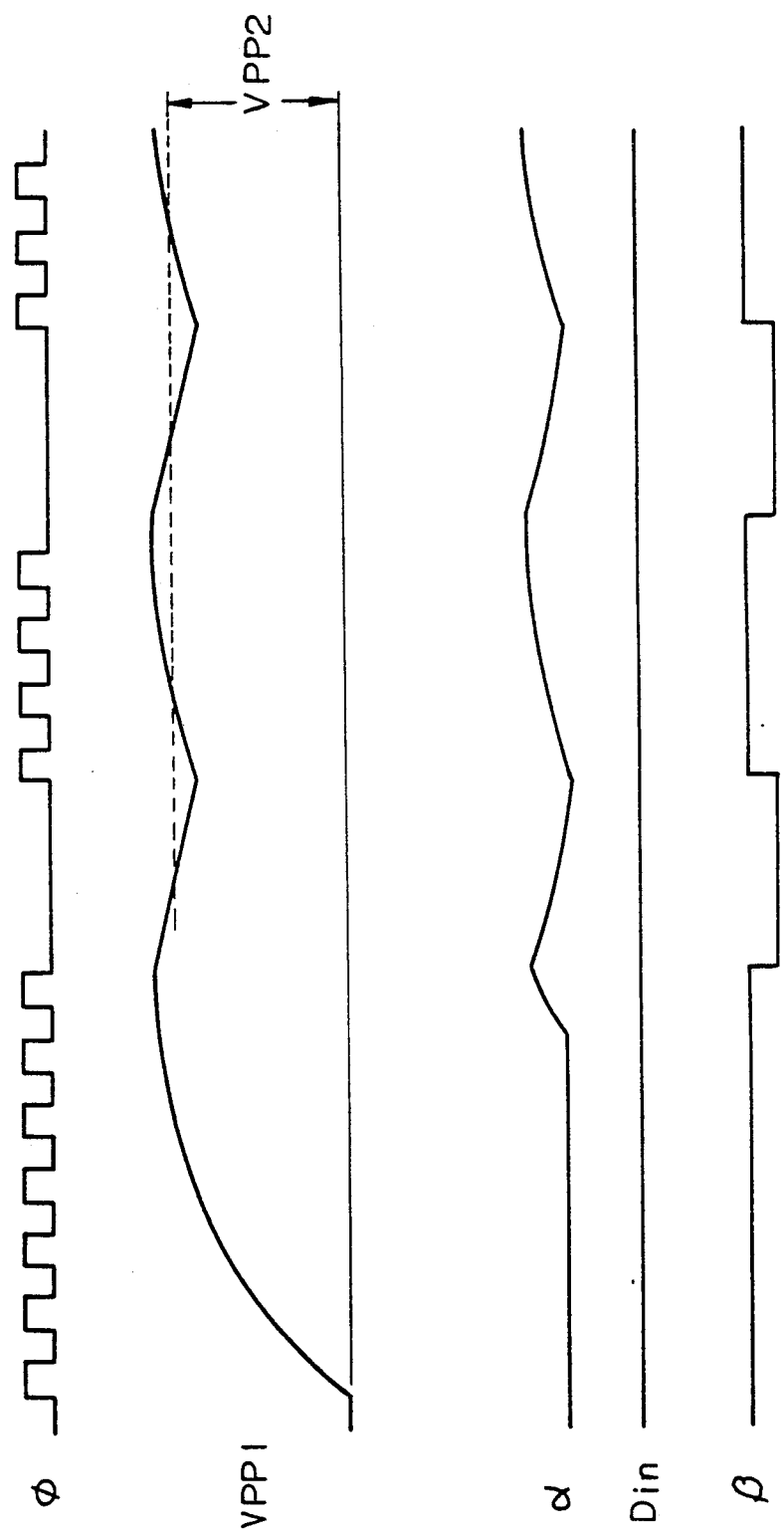
FIG. 4(b) is a timing chart of the EEPROM system illustrated in FIG. 4(a)

FIG. 4(b) illustrates the timing of each signal leading to the high voltage signal VPP1. In FIG. 4(b), $\alpha$ denotes a signal applied to the negative input of the comparator 86 and $\beta$ denotes the stop signal applied by the output of the comparator 86 to the stop terminal 42 of the clock pulse generator 40.

If the high voltage signal VPP1 exceeds approximately 15 V and the potential ($\alpha$) of the negative input of the comparator 86 exceeds the potential of the data signal $D_{in}$, the comparator 86 outputs the stop signal ($\beta$). Then the clock pulse generator 40 stops producing the clock signal $\phi$. Because the pumping circuit 60 cannot receive the energy of the clock signal $\phi$, the pumped high voltage VPP1 then starts decreasing.

If the decreased high voltage signal VPP1 becomes less than the sum of the zener voltage and the data signal $D_{in}$, the comparator 86 stops outputting the stop signal ($\beta$). Therefore, the high voltage signal VPP1 starts to increase again.

By means of repetition of the above mentioned effect, as a result, the high voltage signal VPP1 is approximately maintained at a predetermined level (up to about 22 V) which corresponds to the level of the data signal $D_{in}$.

Further, the high voltage signal VPP1 is regulated by the regulator circuit 100 and becomes a stable high voltage signal VPP2 whose range is approximately 15 to 20 V. The level of the stable high voltage signal VPP2 corresponds to the level of the data signal D$_{in}$, approximately that of biased 15 V.

Figure 7:
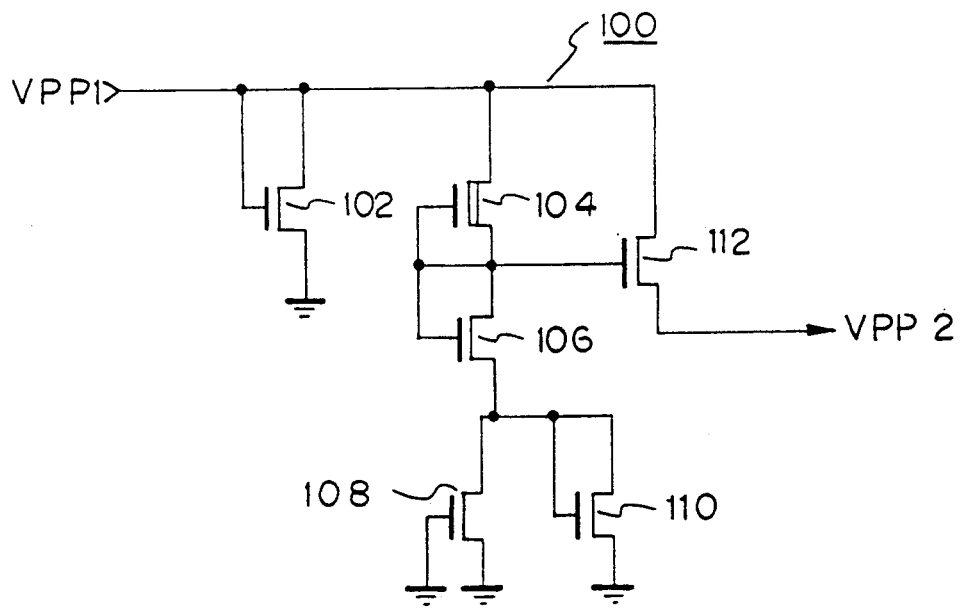
FIG. 7 is a detailed circuit diagram of the regulator circuit of the EEPROM system illustrated in FIG. 4(a)

As shown in FIG. 7, the regulator circuit 100 comprises a pull down FET 102, control FET's 104, 106, 108 and 110 for controlling the pull down FET 102, and an output FET 112. This circuit configuration is also conventional and the details are described in the Japanese Kokai Publication 59693/89.

The stable high voltage signal VPP2 is applied to the switching circuit block 120 for performing both the writing operation and the erasing operation. The switching circuit block 120 comprises a first switching circuit 120A for performing the writing operation and a second switching circuit 120B for performing the erasing operation. This circuit configuration is also conventional and the details are described in the Japanese Kokai Publication 59693/89.

Figure 8:
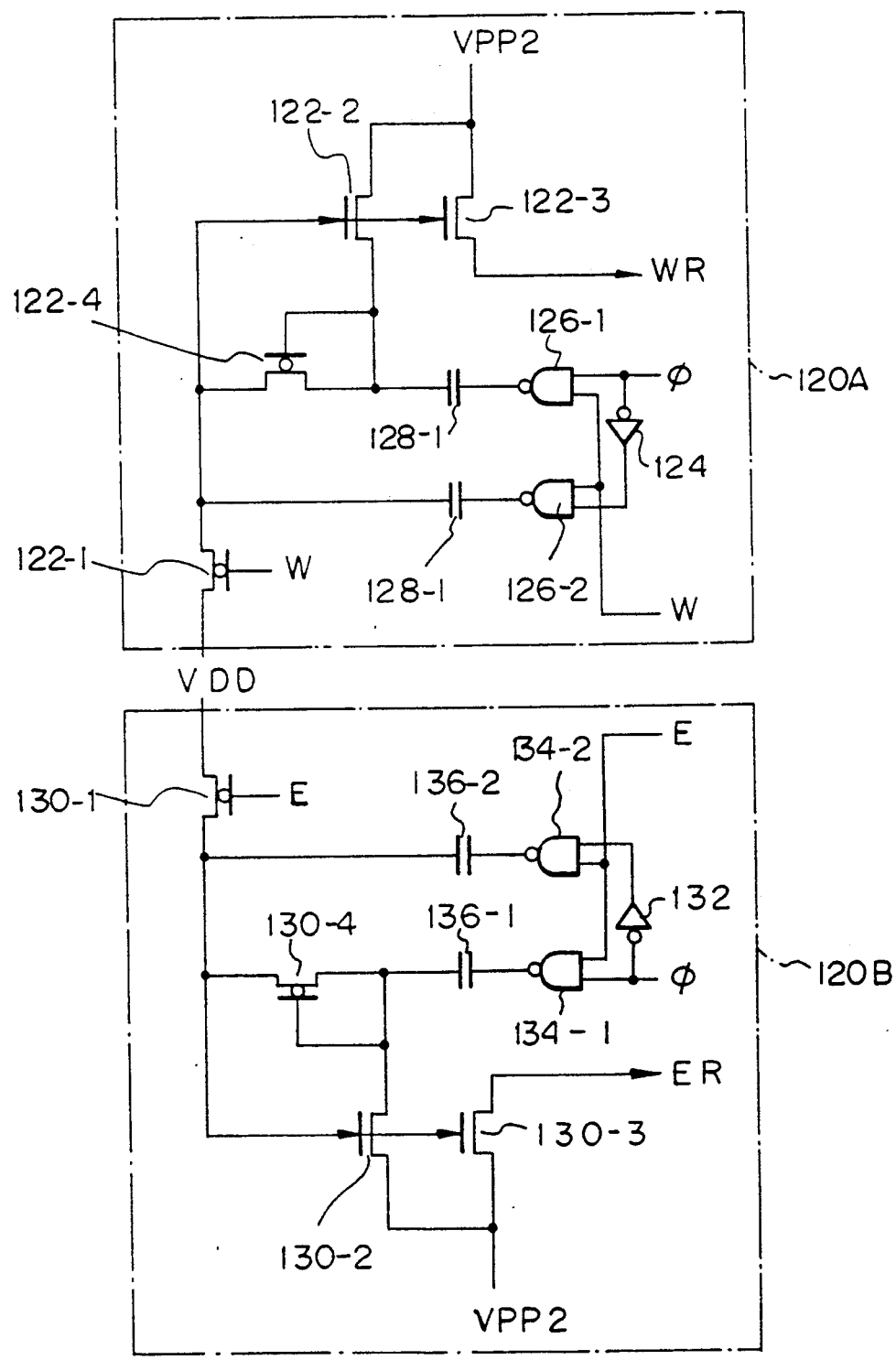
FIG. 8 is a detailed circuit diagram of the pair of switching circuits of the EEPROM system illustrated in FIG. 4(a)

As shown in FIG. 8, the first switching circuit 120A, is used for producing a high voltage writing pulse signal WR which consists of a number of pulses of fixed width and amplitude. The circuit 12A comprises an enhancement type FET 122-1 which is connected to the voltage source VDD and is activated by an "H" level write enable signal W, NAND gates 126-1 and 126-2 receive the high voltage signal VPP2, and an inverter 124 and two capacitors 128-1 and 128-2 which are respectively driven by the NAND gates 126-1 and 126-2. A group of driver FET's of the enhancement type 122-2, 122-3, and 122-4, is used for outputting the high voltage writing pulse signal WR.

The second switching circuit 120B has a circuit configuration similar to that of the first switching circuit 120A. The second switching circuit 120B includes an enhancement type FET 130-1 which is connected to the voltage source VDD, and is activated by an erase enable signal E. Circuit 120B also includes NAND gates 134-1 and 134-2 which are activated by the "H" level erase enable signal E, an inverter 132, and two capacitors 128-1 and 128-2 which are respectively driven by the NAND gates 136-1 and 136-2. A group of driver FET's of enhancement type 130-2, 130-3, and 130-4 is provided at the output of the circuit 120B for outputting a high voltage erasing pulse signal ER. The switching circuits 120A and 120B are capable of producing high voltage pulses WR and ER which have rise times of approximately 1 ms.

As shown in FIG. 4(a), the write enable signal W, the erase enable signal E, the high voltage writing pulse signal WR and high voltage erasing pulse signal ER are applied to the memory cell/reading circuit 140.

Figure 9:
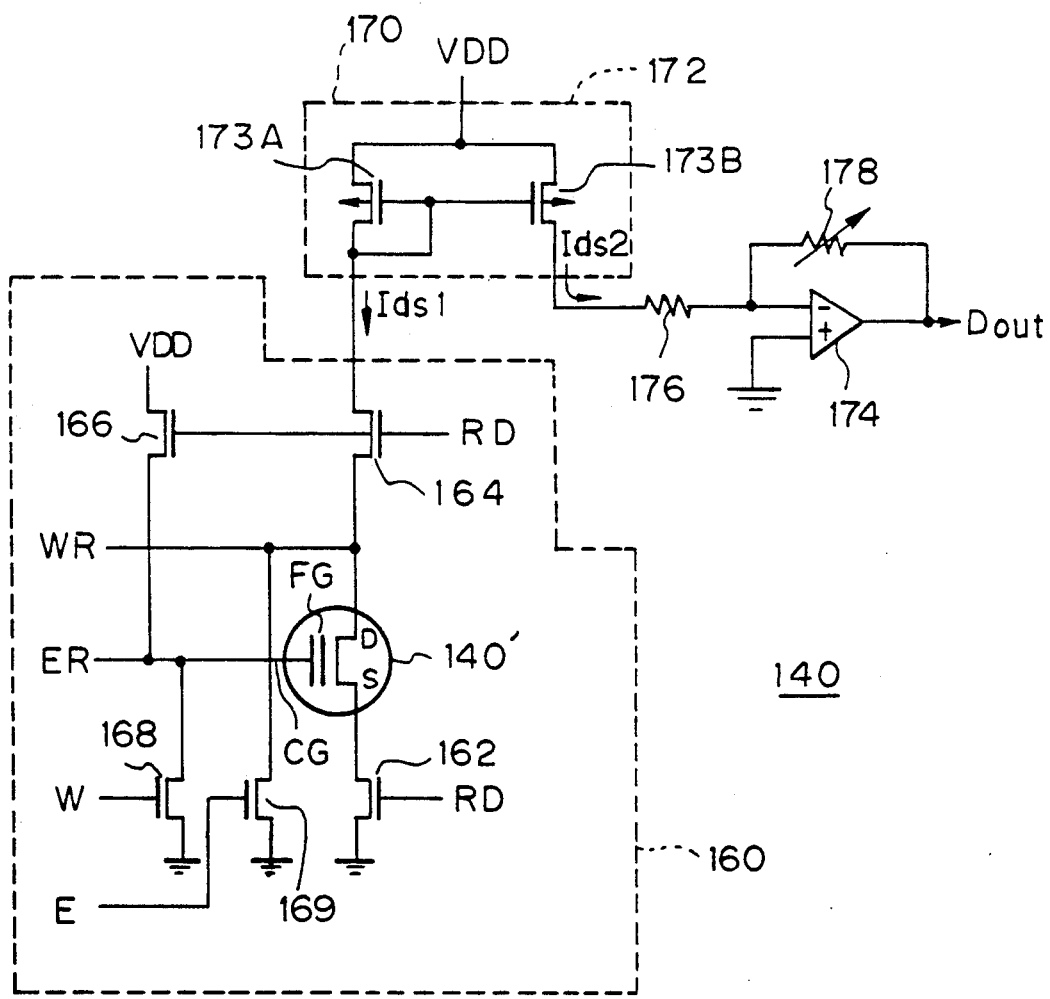
FIG. 9 is a detailed circuit diagram of one of the memory cell and a reading circuit for use in the EEPROM system of FIG. 4(a)

FIG. 9 illustrates a memory cell/reading circuit 140 which includes a reading circuit portion 170, and a memory circuit portion 160 having a memory cell 140'.

The memory cell portion 160 mainly comprises the memory cell 140' which may be in the form of a FLOTOX transistor as illustrated in FIG. 3(a). As shown in FIG. 9, the high voltage writing pulse signal WR is applied to the drain D of the memory cell 140', and the write enable signal W controls the potential of the control gate CG of the memory cell 140 via an FET 168.

Further, the high voltage erasing pulse signal ER is applied to the control gate CG, and the erase enable signal E controls the potential of the drain D via an FET 169. Further, the potential of the source S is controlled by a read data signal RD via an FET 162, and the connection to the reading circuit portion 170 is also controlled by the read data signal RD via an FET 164.

The read data signal RD further controls applying a reading potential from voltage source VDD to the control gate CG by an FET 166.

During the writing operation, the "H" level write enable signal W grounds the control gate CG through the FET 168, and the high voltage writing pulse signal WR (15-20 V) is applied to the drain D. Therefore, positive electric charges are stored in the floating gate FG of the memory cell 140'.

On the other hand, during the erasing operation, the "H" level erase enable signal E is applied to an FET 169 which is coupled to the drain D, causing the drain D to be grounded, while the high voltage erasing pulse signal ER (15-20 V) is applied to the control gate CG. As a result, the stored positive electric charges flow away from the floating gate FG.

During a reading operation, a read data signal RD is applied to the FET's 162, 164, and 166 which are respectively coupled to the source S, the drain D and the control gate CG. Therefore, by so activating the FET's 162, 164 and 166, the voltage source VDD is applied via FET 166 to the control gate CG and a current Ids1 from a current mirror circuit 172 is applied to the drain D since the source S is grounded by the activated FET 162. The amount of the drain current Ids1 corresponds to the amount of the stored positive electric charge.

The current mirror circuit 172 comprises a pair of p-channel FET's 173A and 173B whose drains are commonly connected to the voltage source VDD and gates are commonly connected to a source of the p-channel FET 173A. Since the drain current Ids1 flows through the FET 173A, a corresponding mirror current Ids2 flows through the FET 173B. The mirror current Ids2 flows to an operational amplifier (hereinafter, OPA) 174 via a load resistor 176. Since the OPA 174, has a variable feedback resistor 178 for adjustment, forms a current to voltage converter, the OPA 174 outputs an output data signal D$_{out}$ whose potential corresponds to the amount of the mirror current Ids2.

As a result, the potential of the output data signal D$_{out}$ corresponds to the potential of the applied data signal D$_{in}$ during the writing operation. Therefore, if the data signal D$_{in}$ has a predetermined value selected from the range 0 V to 5 V, the output signal can be caused to have the same value by selecting proper circuit parameters, such as the number of pumping stages, the capacitances of the capacitors 128-1, 128-2, 136-1, and 136-2, and the value of the feedback resistor 178.

Since the value of D$_{in}$ is effectively stored in the memory 140' and is read out as D$_{out}$, the nonvolatile memory system of the invention can have as many different states (stores as many different values) as there are distinct values of D$_{in}$. For example, while a conventional memory system stores D$_{in}$=5 volts as an "H" level or "1" and D$_{in}$=0 volts as "L" level or "0", the nonvolatile memory system according to the invention can also store 2.5 V as an "M" (middle) level or "0.5".

The circuit configuration according to the first embodiment of the invention can be modified. For example, the memory cell/reading circuit 140 can be modified in a number of ways.

Figure 10:
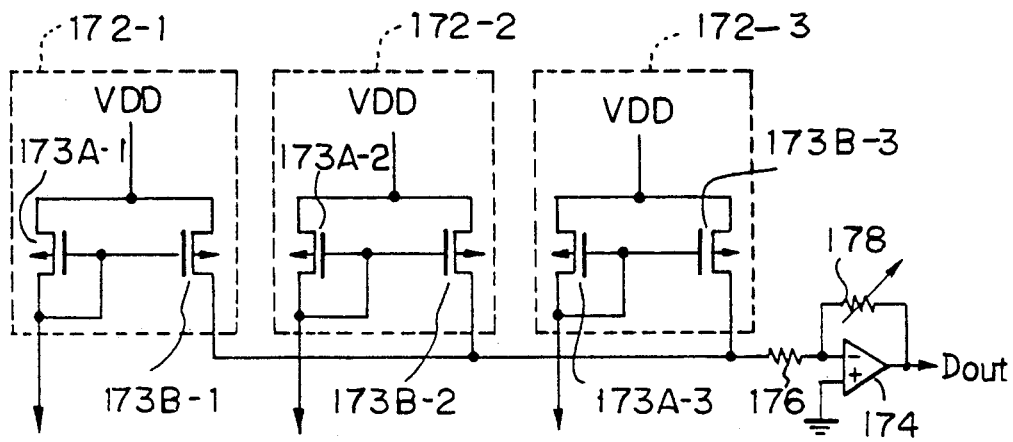
FIG. 10 is another detailed circuit diagram of an alternative reading circuit for use in the EEPROM system of FIG. 4(a)

FIG. 10 illustrates a first variation of the reading circuit portion 170. As shown in FIG. 10, the modified reading circuit comprises three current mirror circuits 172-1, 172-2, and 172-3, each of which comprises a pair of p-channel FET's, (173A-1, 173B-1), (173A-2, 173B-2), and (173A-3, 173B-3). The outputs of the FET's 173B-1, 173B-2, and 173B-3 are serially connected to the OPA 174 via the load resistor 176. Further, those outputs of the FET's 173A-1, 173A-2, and 173A-3 are connected to memory cell circuits (not illustrated in FIG. 10) respectively identical to the memory portion 160 of the circuit shown in FIG. 9. According to this circuit configuration, the three values stored in the three memory cells can be read out by the single common OPA 174 in different timing.

Figure 11:
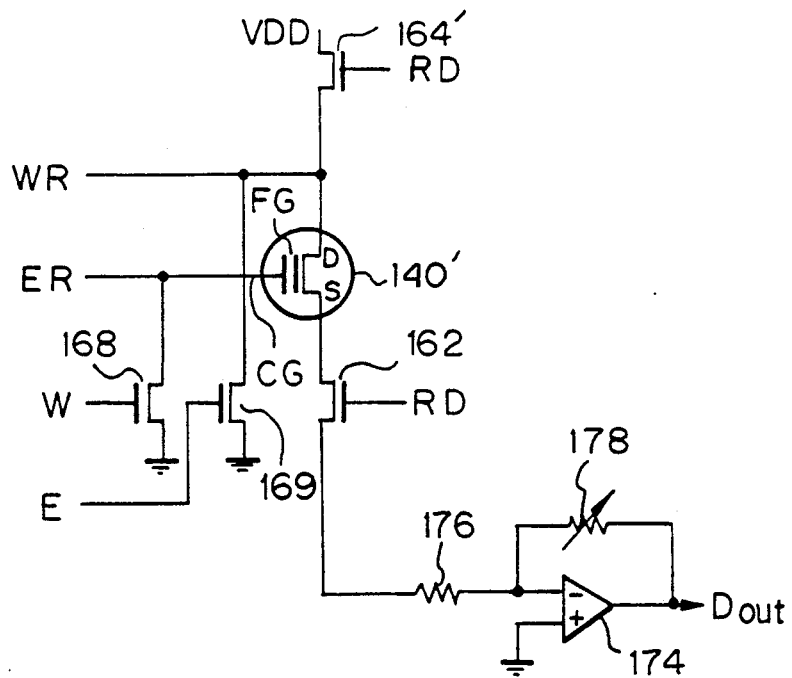
FIG. 11 is a detailed circuit diagram of another combination of a memory cell and a reading circuit for use in the EEPROM system of FIG. 4(a)

FIG. 11 illustrates a second variation of the memory cell/reading circuit 140. As shown in FIG. 11, this circuit configuration, otherwise identical to that of FIG. 9, omits the use of one or more current mirror circuits described above and provides the OPA 174 directly at the source S of the memory cell 140. Therefore, the drain D of the memory cell 140' is connected to the voltage source VDD via an FET 164'.

Figure 12:
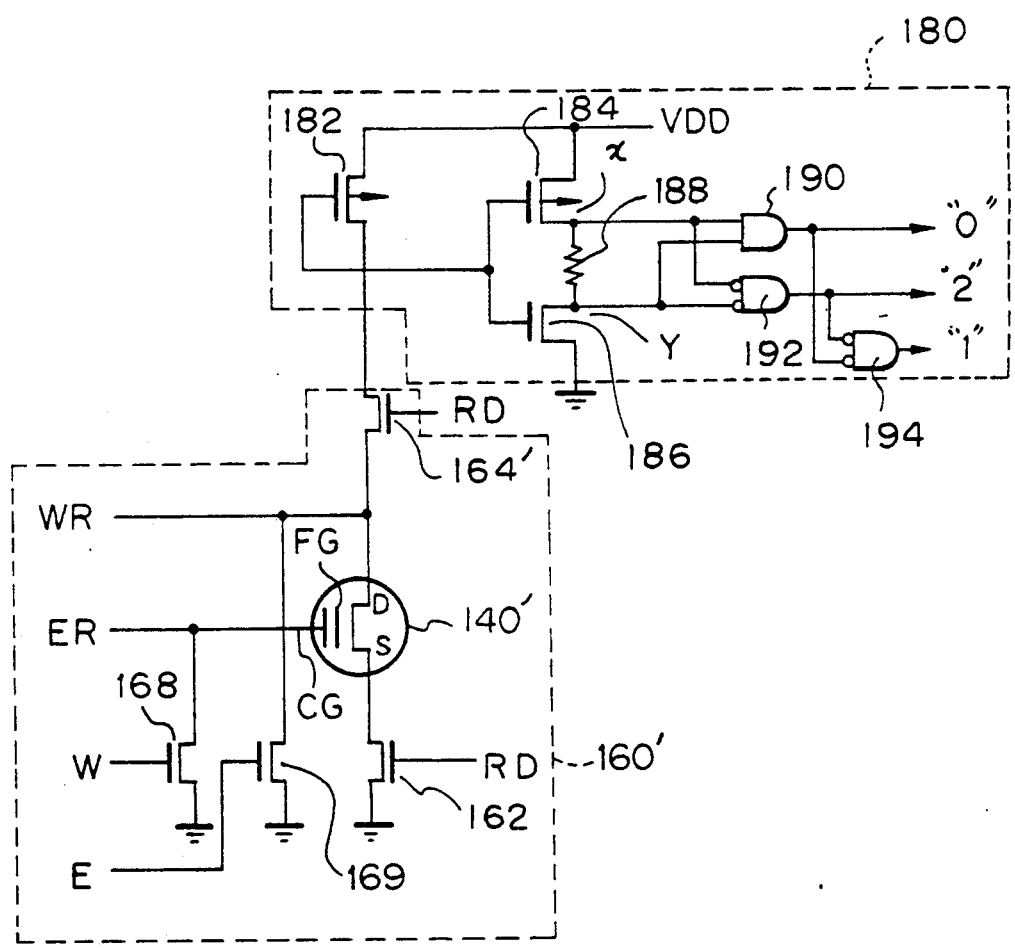
FIG. 12 is a detailed circuit diagram of a further combination of a memory cell and a reading circuit for use in the EEPROM system of FIG. 4(a)

FIG. 12 illustrates a third variation of the memory cell/reading circuit 140. The memory cell/reading circuit includes a memory circuit portion 160' which is identical to the memory cell portion 160 illustrated in FIG. 9 except FET 166 for applying reading potential VDD to the control gate CG.

The level detection circuit 180 is similar in purpose to that of the reading circuit 170 of FIG. 9. The level detection circuit 180 includes a p-channel depletion type FET's 182 and 184, both of whose sources are commonly connected to the voltage source VDD and gates are commonly connected, an enhancement type FET 186 whose gate is also connected to the gates of the FET's 182 and 184, a resistor 188 which connects a drain of the FET 186 and a source of the FET 184, an AND gate 190 having two inputs connected to opposite ends of the resistor 188, and a first NOR gate 192 having two inputs connected to the opposite ends of the resistor 188, and a second NAND gate 194 having two inputs one of which is connected to an output of the AND gate 190 and the other of which is connected to an output of the first NAND gate 192.

The memory cell portion 160' is identical to the memory circuit portion 160 of FIG. 9 except that the voltage VDD is not applied to the control gate during the erasing operation and the FET 166 is therefore not required. The other FET's, 162, 168, 169, and 164' are identical to the FET's disclosed in FIG. 9.

The memory cell portion 160' is connected to the level detection circuit 180 via the FET 164' at a source of the FET 182.

The reading circuit shown in FIG. 12 is designed to recognize three information states stored in the memory cell. Thus, if the memory cell 140 stores a zero ("0") value, there is no drain current and the gate of the p-channel FET 182 "L" level. Therefore, the p-channel FET 184 is "ON" and the enhancement type FET 186 is "OFF". As a result, the inputs of the AND gate 190 and the NOR gate 192 both are at the level "H" and the inputs of the NOR gate 194 are at the "H" and "L" levels, respectively. Therefore, only the AND gate 190 outputs an "H" level signal, which designates the "0" value.

If the memory cell 140 stores a "L", value, the drain current flow is sufficient to satisfy the TTL (Transistor-Transistor Level) level, the gate of the p-channel FET 182 is at the "H" level, the p-channel FET 184 is "OFF" and the enhancement FET 186 is "ON". Therefore, both of the inputs of the AND gate 190 and the NOR gate 192 becomes "L" and each of the inputs of the NOR gate are at "H" and "L" levels, respectively.

Therefore, only the NOR gate 192 outputs an "H" level signal, which designates the "2" value.

If the memory cell 140 stores half of the amount of electric charges required to output the above "2" value the drain current is smaller and the potential at the gate of the p-channel FET 182 is below the TTL level. In this case, the p-channel FET 184 is still "ON" and the enhancement type FET 186 is also "ON". As a result, a current flows from the voltage source VDD to the ground via the resistor 188. Therefore, the potential at the positive side X of resistor 188 (at the source of FET 184) is at the "H" level, and the potential at the negative side Y of resistor 188 (at the drain of FET 186) is at the "L" level due to the voltage drop across the resistor 188. As a result, an "H" level and an "L" level are provided at the respective inputs of both the AND gate 190 and the NOR gate 192, and both of inputs of the NOR gate 194 are at the "L" level. Therefore, only the NOR gate 194 outputs an "H" level signal, which designates the "1" value.

SECOND EMBODIMENT

Figure 13A:
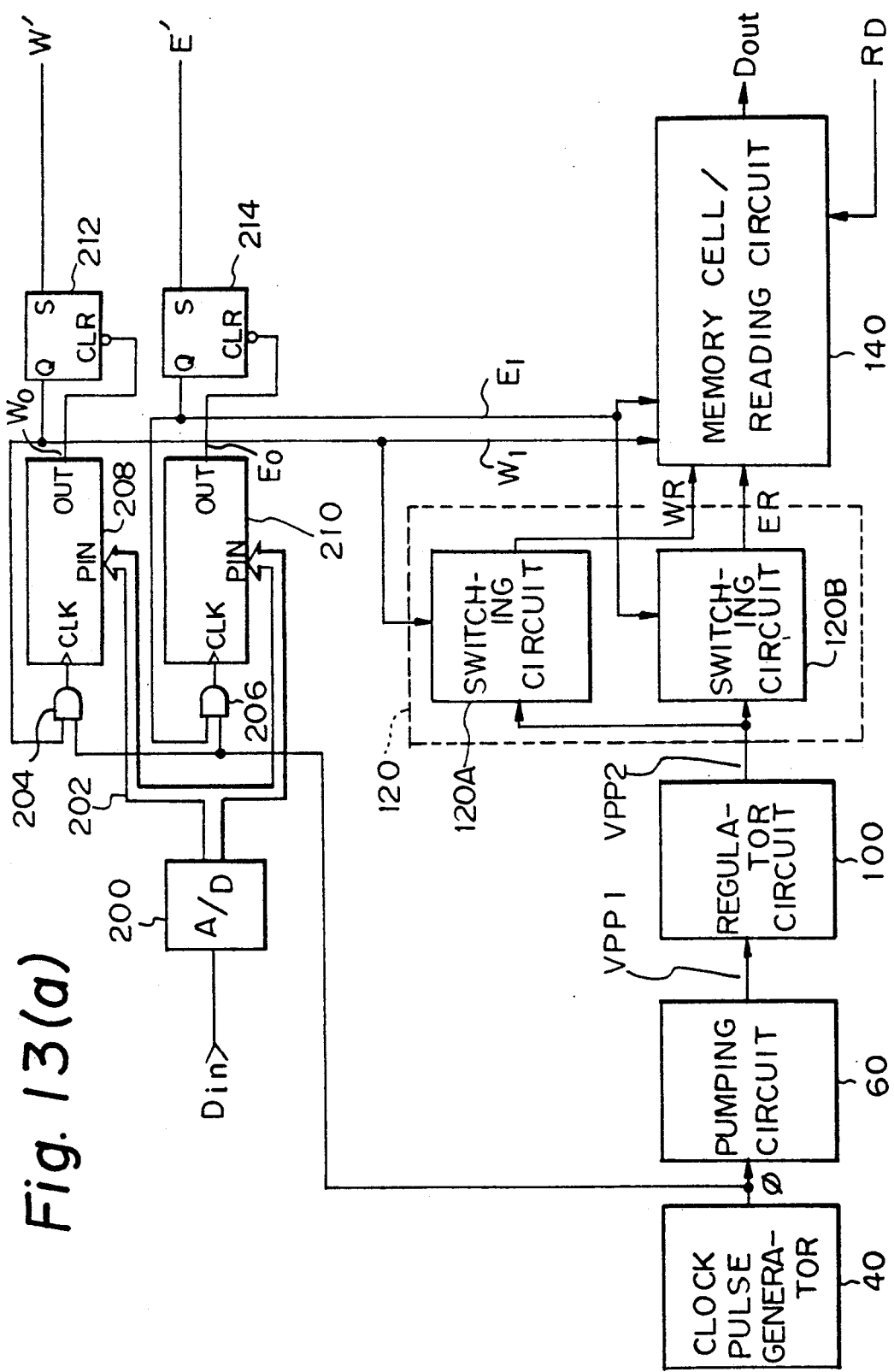
FIG. 13(a) is a block diagram of an EEPROM system according to a second embodiment of the invention.

A second embodiment of the invention, illustrated in FIG. 13(a), is a nonvolatile memory system for multiple value storage, wherein storage of positive electric charges can be controlled by the width of a single pulse forming either the high voltage writing signal WR, or the low voltage erasing signal ER. In FIG. 13(a), the same denote the same elements as in the first embodiment. The main part of the second embodiment also comprises in series a clock pulse generator 40, a pumping circuit 60, a regulator circuit 100, a switching circuit block 120, and a memory cell/reading circuit 140.

In this embodiment, there are further featured an analog to digital converter 200 (hereinafter, ADC) which receives the data signal $D_{in}$ and converts it in a digital form, two of programmable 8-bit counters 208 and 210, each of which receives the converted data signal $D_{in}$ respectively via a parallel 8 bit bus 202 connected to the ADC 200, two AND gates 204 and 206 each of which is driven by the clock signal $\phi$ and also driven by a write enable signal W' and an erase enable signal E' respectively via respective flip-flop circuits 212 and 214. Further, the outputs of the AND gates 204 and 206 respectively drive the clock inputs CLK of the counters 208 and 210. Further, outputs $W_0$ and $E_0$ of the counters 208 and 210 are respectively applied to the flip-flop circuits 212 and 214 to reset those flip-flop circuits. Those elements are realized by appropriate conventional ICs.

For example, the ADC could be a type ADC0803 analog to digital converter made by National Semiconductor, Inc. and the programmable 8-bit counters could be type 74190 counter IC's made by Texas Instruments Inc.

In this embodiment, an output $W_1$ of the flip-flop circuit 212, which also drives the AND circuit 204, is utilized like the write enable signal W disclosed in the first embodiment in FIG. 4(a) and an output $E_1$, which also drives the AND circuit 206, is utilized like the erase enable signal E disclosed in the first embodiment.

In detail, in the operation of this embodiment, the analog data signal $D_{in}$ is converted to an 8-bit data signal and the 8-bit data signal is applied to both of the programmable 8-bit counters 208 and 210 which in response store a corresponding 8-bit value. Further, during a writing operation, the write enable signal W' is applied to the flip-flop circuit 212 and an output $W_1$ of the flip-flop circuit 212 is applied to the switching circuit 120A and to the memory cell/reading circuit 140. The functions of the output $W_1$ in the circuits 120A and 140' are the same as those of the write enable signal W disclosed in the first embodiment (see, e.g., FIGS. 4(a), 8 and 9).

The output W1 and the clock signal $\phi$ are applied to the AND gate 204 and drives the counter 208. In other words, the clock signal $\phi$ is applied to the counter 208 only when the write enable signal W' is applied to the flip-flop circuit 212.

Since the counter 208 has already received the 8-bit data signal via the 8-bit data bus 202 and stored the corresponding 8-bit value in its registor (not shown), the counter 208 starts to decrement the stored 8-bit value in timed sequence with the clock signal $\phi$. If the counter 208 counts the 8-bit value, the counter 208 applies a write stop signal $W_0$ to the clear port CLR of the flip-flop circuit 212 to clear the output W1 of the flip-flop circuit 212.

In an erasing operation, an erase enable signal E' is applied to the flip-flop circuit 214 and in response an output $E_1$ of the flip-flop circuit 214 is applied to the switching circuit 120B and to the memory cell/reading circuit 140. The functions of the output $E_1$ in the circuits 120B and 140 are the same as those of the erase enable signal E in the first embodiment (see, e.g., FIGS. 4(a), 8 and 9).

The output $E_1$ and the clock signal $\phi$ are applied to the AND gate 206 so that the clock signal $\phi$ is applied to the counter 210 to drive the counter 210, only when the erase enable signal E' is applied to the flip-flop circuit 214.

When the counter 210 has received the 8-bit data signal via the 8-bit data bus 202 and stored the signal in its register (not shown), the counter 210 starts to decrement the stored 8-bit number in timed sequence with the clock signal $\phi$. If the counter 210 counts the 8-bit value down to zero, the counter 210 applies an erase stop signal $E_0$ to the clear input CLR of the flip-flop circuit 214 to clear the output $E_1$ of the flip-flop circuit 214.

Figure 13B:
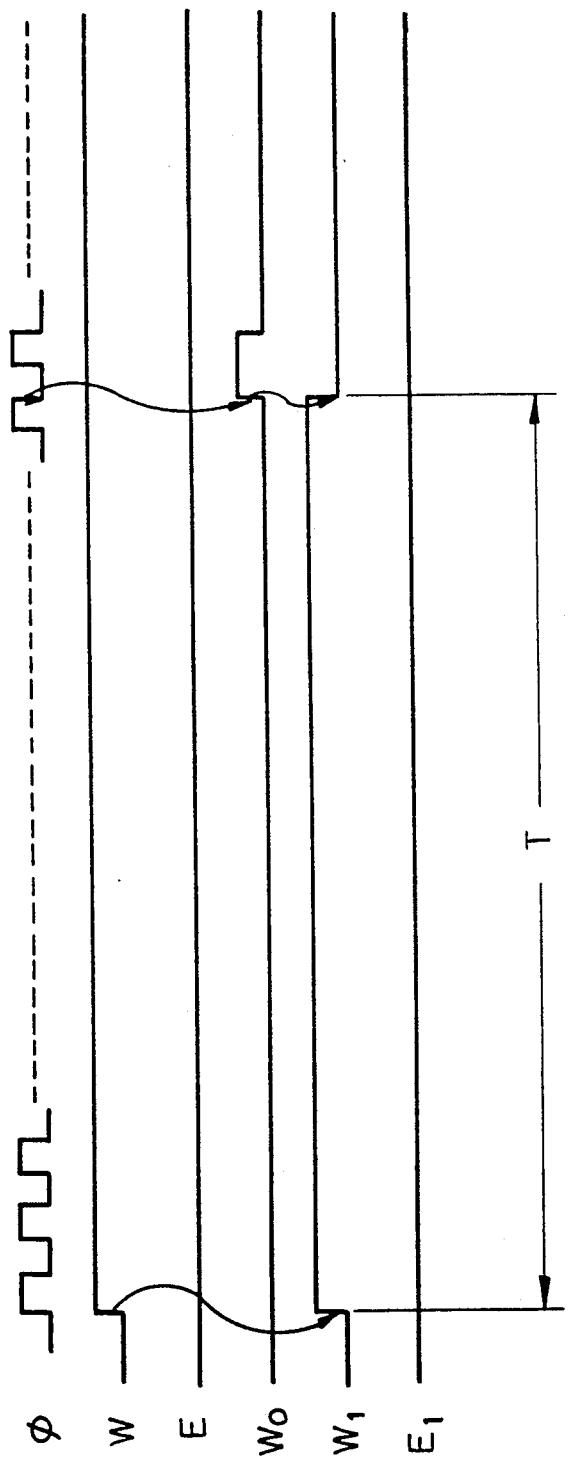
FIG. 13(b) is a timing chart of the EEPROM system illustrated in FIG. 13(a)

FIG. 13(b) is a timing chart for an exemplary writing operation. In this embodiment, since the stable high voltage signal VPP2 is generated constantly by pumping operation, only an interval of the applying high voltage write signal WR is controlled by the write enable signal $W_1$. As shown in FIG. 13(b), because the flip-flop circuit 212 maintains the status of it's own output W1 until it is cleared by the output $W_0$ of the counter 208 which is generated when the counter 208 counts the digital value of the data signal $D_{in}$, it is possible to control the interval of application of the high voltage write signal WR to the memory cell/reading circuit 140.

In other words, the pulse width T of the output W1 is controlled by the number of clock pulses required to count down the 8-bit number stored in the counter 208 in response to the data signal $D_{in}$. Therefore, a predetermined amount of the electric charge can be applied to the memory cell 140' and perform substantially the same functions performed by the first embodiment.

THIRD EMBODIMENT

Figure 14A:
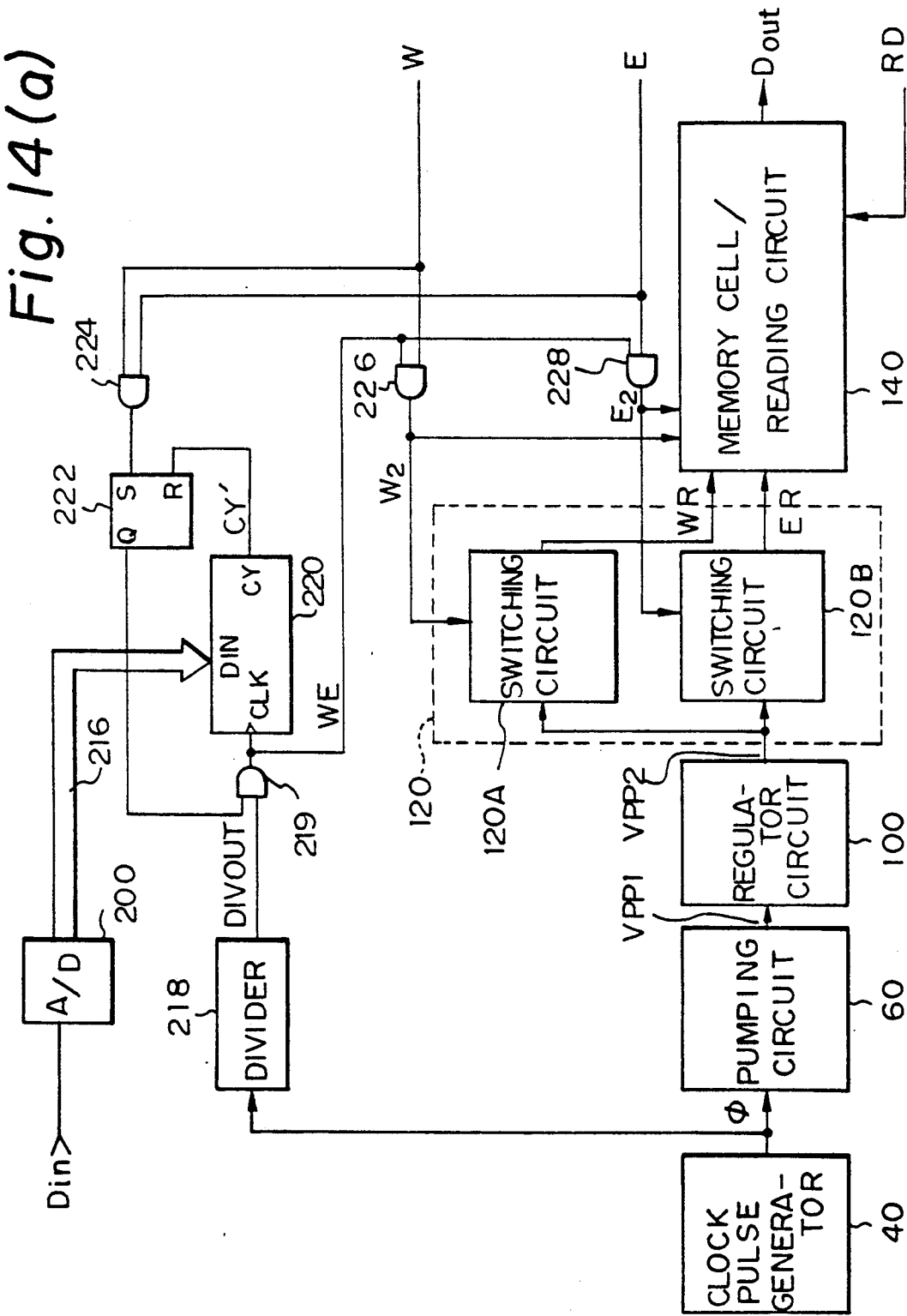
FIG. 14(a) is a block diagram of an EEPROM system according to a third embodiment of the invention.

In FIG. 14(a), the same reference characters in FIG. 4(a) or FIG. 13(a) denote substantially the same elements.

As shown in FIG. 14(a), the third embodiment also mainly comprises in series of a clock pulse generator 40, a pumping circuit 60, a regulator circuit 100, a switching circuit block 120, and a memory cell/reading circuit 140. In this third embodiment, there are further featured the ADC 200 which receives the data signal $D_{in}$ and outputs the 8-bit digital data signal via an 8-bit bus 216, a divider circuit 218 which receives the clock signal $\phi$ and divides it to a divided clock signal DIVOUT, a programmable 8-bit counter 220 which receives the 8-bit data signal and is driven by the divided clock signal DIVOUT via a first AND gate 219, a flip-flop circuit 222 which also drives the first AND gate 219 in response to the write enable signal W via an OR gate 224 whose input is also driven by the erase enable signal E, a second AND gate 226 driven by the write enable signal W and the output of the first AND gate 219, whose output W2 is applied to the switching circuit 120A and the memory cell/reading circuit 140, a third AND gate driven by the erase enable signal E and the output of the first AND gate 219, whose output E2 is applied to the switching circuit 120B and the memory cell/reading circuit 140. Further, the output of the counter 220 is applied as a cycle stop signal CY' to the flip-flop circuit 222 to clear the flip-flop circuit 222.

In the third embodiment, the amount of positive electric charge to be stored in the memory cell 140' is controlled by the number of pulses of the high voltage writing and erasing signals.

Initially, the data signal $D_{in}$ is converted to an 8-bit data signal by the ADC 200 and applied to the counter 220 via the 8-bit data bus 216. The clock signal $\phi$ then is applied to the divider circuit 218. The divider circuit 218 divides the clock signal $\phi$ according to a predetermined cycle, so that the clock signal, which typically has such a high frequency signal that it is hard to use the clock timing, for a becomes a more usable writing operation. For example, the divider current 218 is provided to divide the frequency of the clock signal $\phi$ by 65536. Thus, if the clock signal $\phi$ is a 10 MHz signal having 100 $\mu$s interval, the divider circuit 218 divides the clock signal $\phi$ by 65536 to produce a 6.5 ms interval signal. The divider circuit 218 could be comprised of two 1/256 divider IC's such as two type 74190 IC's (made by Texas Instruments) which are connected in series.

In performing a writing operation using the third embodiment, similar to doing so with the second embodiment of the invention illustrated in FIG. 13(a), the write enable signal W is applied to the first AND gate 219 via the flip-flop circuit 222 and the OR gate 224, and an output signal DIVOUT of the divider circuit 218 is also applied to the first AND gate 219. The output of the first AND gate 219 is connected to a clock terminal CLK of the counter 220. Therefore, in performing the writing operation, the divided clock signal DIVOUT is applied to the counter 220 only when the write enable signal W is "H" (high). The divided clock signal DIVOUT is also applied as a common control signal WE to the switching circuit 120A and the memory cell/reading circuit 140 via an second AND gate 226. The second AND gate 226 is controlled by the write enable signal W. The output W2 of the second AND gate 226 has the same functions as those the write enable signal W has in the first embodiment of the invention (see, e.g., FIGS. 4(a), 8 and 9).

The counter 220 counts down to zero the stored 8-bit value using the divided clock signal DIVOUT, at which time the counter 220 outputs from its CY output a cycle stop signal CY' to the flip-flop circuit 222 to reset its output Q. When the Q output is reset, the AND gate 219 is turned off by receiving "L" level output Q, and as a result, the high voltage write pulse signal WR is stopped.

In performing a erasing operation with the third embodiment, similarly to performing the writing operation, the erase enable signal E is applied to the flip-flop circuit 222 via the OR gate 224 and the output signal DIVOUT of divider circuit 218 is applied to the first AND gate 219. Since the output of the first AND gate 219 is connected to the clock terminal of the counter 220, the divided clock signal DIVOUT is applied to the counter 220 only when the erase enable signal E is high ("H"). The divided clock signal DIVOUT is also applied to the switching circuit 120B and the memory cell/reading circuit 140 via an AND gate 228. The AND gate 228 is controlled by the erase enable signal E. The output E2 of the AND gate 228 has the same functions as the erase enable signal E has in the first embodiment of the invention.

The counter 220 counts down to zero the stored 8-bit value using divided clock signal DIVOUT, the counter 220 outputs the cycle stop signal CY' from its CY output to the flip-flop circuit 222 to reset its Q output. When Q output is reset, the AND gate 219 is turned off and as a result, the high voltage erase pulse signal ER is stopped.

FIG. 14(b) is a timing chart for the writing operation on the circuit shown in FIG. 14(a) in a case in which the clock signal ϕ is a 10 MHz signal and the number "2" is stored in the counter 218. As shown in this chart, briefly, when the write enable signal becomes "H", the output Q of the flip-flop circuit 222 maintain the "H" level. During that time, the counter 220 is driven by the divided clock signal DIVOUT. At the same time, the divided clock signal DIVOUT is also applied to the switching circuit 120A and the memory cell/reading circuit 140 via the second AND gate 226 controlled by the write enable signal W.

In this chart, the pulse width TW is 3.25 ms and the cycle stop signal CY' is produced at the end of the second pulse of the DIVOUT signal.

It will be understood that the above description of the present invention is susceptible to various modifications, changes and adaptations, and the same are intended to be comprehended within the meaning and range of equivalents of the appended claims. Thus, of course, the invention is not limited in the disclosed embodiments and further modifications are contemplated. For example, with reference to the first embodiment, it would be possible to provide a lower level power source and to redesign the pumping circuit disclosed in the Japanese Kokai Publication 59693/89 and the CMOS circuit configuration for less power consumption. Further, with reference to the second and third embodiments, other counters and another divider could be used. Moreover, it would be possible to select another pulse width.

What is claimed is:

1. A nonvolatile memory system for multiple value storing, comprising:
    a memory cell having an input terminal, an output terminal, a control terminal, and nonvolatile storing means for storing electric charge and establishing a voltage threshold between the input terminal and the output terminal for influencing a current therebetween, the voltage threshold having a level which is dependent upon the amount of the electric charge stored by said storing means;
    writing means, coupled to the input terminal and responsive to an input data signal having any one of at least three different values, for inputting to the storing means through the input terminal one of at least three different amounts of electric charge corresponding to the respective at least three different values of the input data signal, said writing means including:
        writing potential generating means, including
            a pulse generating means for generating clock pulses,
            a pumping circuit,
            transferring means for transferring the clock pulses from the pulse generating means to the pumping circuit, said pumping circuit having means, responsive to the clock pulses transferred thereto by said transferring means, for generating a writing potential signal having a voltage level which increases upon transfer of the clock pulses to said pumping circuit by said transferring means, and
        means for comparing a voltage level of the input data signal and the voltage level of the writing potential signal to obtain a comparison result and interrupting transfer of clock signals to said pumping circuit according to the comparison result, so as to maintain the voltage level of the writing potential signal higher than and in correspondence to the level of the input data signal, and
        a switching circuit, coupled to said pumping circuit and said input terminal, for applying the writing potential signal to said input terminal; and
    reading means, activated by a read data signal applied thereto, for measuring said level of said voltage threshold, and outputting an output data signal having a value which corresponds to the measured level of said threshold voltage.

2. A nonvolatile memory system for multiple value storing according to claim 1, further comprising first grounding means for selectively grounding the control terminal, wherein said writing means is responsive to the input data signal for inputting the electric charge to said storing means only when the control terminal is grounded by said grounding means.

3. A nonvolatile memory system for multiple value storing according to claim 1, wherein the system further includes:
    second grounding means for selectively grounding the input terminal; and
    erasing means, connected to the control terminal, for applying an erasing potential to the storing means through the control terminal when the input terminal is grounded by said second grounding means, so as to drain the electric charge from said storing means.

4. A system as in claim 1, wherein said memory cell is an EEPROM cell.

5. A nonvolatile memory system for multiple value storing, comprising:
    a memory cell having an input terminal, an output terminal, a control terminal, and nonvolatile storing means for storing electric charge and establishing a voltage threshold between the input terminal and the output terminal for influencing a current therebetween, the voltage threshold having a level which is dependent upon the amount of the electric charge stored by said storing means;

writing means, coupled to the input terminal and responsive to an analog input data signal having any one of at least three different values, for inputting to the storing means through the input terminal one of at least three different amounts of electric charge corresponding to the respective at least three different values of the input data signal, said writing means including:

an analog-to-digital converter for converting the input data signal to a digital data signal representing a numerical value corresponding to the value of the input data signal;

writing potential generating means, including
a pulse generating means for generating clock pulses,
a pumping circuit, and
transferring means for transferring the clock pulses from the pulse generating means to the pumping circuit, said pumping circuit having means, responsive to the clock pulses transferred thereto by said transferring means, for generating a writing potential signal having a voltage level which increases toward a predetermined level greater than a voltage level of the input data signal upon transfer of the clock pulses to said pumping circuit by said transferring means, a switching circuit, coupled to said pumping circuit and the input terminal, for applying the writing potential signal to said input terminal, a counter circuit connected to said analog-to-digital converter for receiving the digital data signal and connected to said clock pulse generator circuit for receiving the clock pulses, said counter circuit having means for storing the numerical value, counting the numerical value down in response to the clock pulses, and producing an output when the numerical value is counted down to a predetermined number, and a control circuit connected to said counter circuit so as to receive the output from said counter circuit, said control circuit having controlling means for controlling said switching circuit, said controlling means including means, responsive to said output, for discontinuing application of the writing potential signal to said input terminal by said switching circuit, thereby to limit the writing potential signal applied to said input terminal to a writing pulse of a predetermined duration corresponding to the numerical value, said memory cell being responsive to the writing potential signal at said input terminal to apply the electric charge to said storing means in an amount which corresponds to said predetermined duration of the writing pulse; and reading means, activated by a read data signal applied thereto, for measuring said level of said voltage threshold, and outputting on output data signal having a value which corresponds to the measured level of said threshold voltage.

6. A nonvolatile memory system for multiple value storing according to claim 5, wherein said switching circuit is responsive to receipt of a write enable signal for applying the writing potential signal to said input terminal, and said writing means has means, responsive to receipt of the write enable signal, for activating the memory cell to apply the electric charge from said input terminal to said storing means in response to the writing potential signal at said input terminal.

7. A nonvolatile memory system for multiple value storing according to claim 5, further comprising first grounding means for selectively grounding the control terminal, wherein said writing means is responsive to the input data signal for inputting the electric charge to said storing means only when the control terminal is grounded by said grounding means.

8. A nonvolatile memory system for multiple value storing according to claim 5, wherein the system further includes:

second grounding means for selectively grounding the input terminal; and erasing means, connected to the control terminal, for applying an erasing potential to the storing means through the control terminal when the input terminal is grounded by said second grounding means, so as to drain the electric charge from said storing means.

9. A nonvolatile memory system for multiple value storing according to claim 5, wherein said memory cell is an EEPROM cell.

10. A nonvolatile memory system for multiple value storing, comprising:

a memory cell having an input terminal, an output terminal, a control terminal, and nonvolatile means for storing electric charge and establishing a voltage threshold between the input terminal and the output terminal for influencing a current therebetween, the voltage threshold having a level which is dependent upon the amount of the electric charge stored by said storing means;

writing means, coupled to the input terminal and responsive to an input data signal having any one of at least three different values, for inputting to the storing means through the input terminal one of at least three different amounts of electric charge corresponding to the respective at least three different values of the input data signal, said writing means including:

an analog-to-digital converter for converting the input data signal to a digital data signal representing a numerical value corresponding to the value of the input data signal, writing potential generating means, including
a pulse generating means for generating clock pulses,
a pumping circuit, and
transferring means for transferring the clock pulses from the pulse generating means to the pumping circuit, said pumping circuit having means, responsive to the clock pulses transferred thereto by said transferring means, for generating a writing potential signal having a voltage level which increases toward a predetermined level greater than a voltage level of the input data signal upon transfer of the clock pulses to said pumping circuit by said transferring means;

a switching circuit, coupled to said pumping circuit and the input terminal, for applying the writing potential signal to said input terminal, timing means, responsive to the clock pulses, for producing writing potential timing pulses from the clock pulses, a counter circuit connected to said analog-to-digital converter for receiving the digital data signal and connected to said timing means for receiving the timing pulses, said counter circuit including means for storing the numerical value, counting the numerical value down in response to the timing pulses, and producing an output when the numerical value is counted down to a predetermined number, and a control circuit connected to said counter circuit so as to receive the output from said counter circuit, said control circuit having controlling means for controlling said switching circuit, said controlling means including timing pulses applying means for applying the timing pulses to said switching means, said controlling means being responsive to said output for discontinuing application of the timing pulses to said switching means by said timing pulses applying means, said switching means being responsive to the application thereto of the timing pulses to apply the writing potential signal to said input terminal as writing potential pulses in timed relation to the timing pulses and to discontinue application of the writing potential pulses in response to discontinuance of the application of the timing pulses to said switching means, thereby to limit a number of writing potential pulses applied to said input terminal to a predetermined number corresponding to the numerical value, said memory cell being responsive to the writing potential pulses at said input terminal to apply the electric charge to said storing means in an amount which corresponds to the number of the writing pulses; and reading means, activated by a read data signal applied thereto, for measuring said level of said voltage threshold, and outputting an output data signal having a value which corresponds to the measured level of said threshold voltage.

11. A nonvolatile memory system for multiple value storing according to claim 10, further comprising first grounding means for selectively grounding the control terminal, wherein said writing means is responsive to the input data signal for inputting the electric charge to said storing means only when the control terminal is grounded by said grounding means.

12. A nonvolatile memory system for multiple value storing according to claim 10, wherein the system further includes:

second grounding means for selectively grounding the input terminal; and erasing means, connected to the control terminal, for applying an erasing potential to the storing means through the control terminal when the input terminal is grounded by said second grounding means, so as to drain the electric charge from said storing means.

13. A nonvolatile memory system for multiple value storing according to claim 10, wherein said memory cell is an EEPROM cell.

* * * * *